United States Patent

Doki et al.

[11] Patent Number: 5,160,397
[45] Date of Patent: Nov. 3, 1992

[54] PLASMA PROCESS APPARATUS AND PLASMA PROCESSING METHOD

[75] Inventors: Masahiko Doki, Sagamihara; Kiyoshi Ooiwa, Yokosuka, both of Japan

[73] Assignee: Fujitsu Limited and Fuji Electric Co., Ltd., Japan

[21] Appl. No.: 516,077

[22] Filed: Apr. 27, 1990

[30] Foreign Application Priority Data

Apr. 27, 1989 [JP] Japan ................................. 1-108553
Jul. 3, 1989 [JP] Japan ................................. 1-171662
Mar. 1, 1990 [JP] Japan ................................. 2-49810

[51] Int. Cl.$^5$ ............................................. H01L 21/00
[52] U.S. Cl. ................................ 156/345; 118/719; 118/723; 204/298.31; 204/298.34; 204/298.37; 156/643
[58] Field of Search ................ 156/345, 643; 118/723, 118/719; 204/298.08, 298.02, 298.16, 298.31, 298.34, 298.37

[56] References Cited

U.S. PATENT DOCUMENTS

| 4,401,054 | 8/1983 | Matsuo et al. | |
|---|---|---|---|
| 4,795,529 | 1/1989 | Kawasaki et al. | 156/345 |
| 4,863,549 | 9/1989 | Grünwald | 204/298.34 |
| 4,891,118 | 1/1990 | Ooiwa et al. | 156/345 |
| 4,960,073 | 10/1990 | Suzuki et al. | 204/298.38 |
| 4,968,374 | 11/1990 | Tsukada et al. | 204/298.31 |
| 4,970,435 | 11/1990 | Tanaka et al. | 118/50.1 |

FOREIGN PATENT DOCUMENTS

| 0145015 | 6/1985 | European Pat. Off. |
| 0171949 | 7/1985 | European Pat. Off. |
| 63-301497 | 12/1988 | Japan |

Primary Examiner—Brian E. Hearn
Assistant Examiner—George Goudreau
Attorney, Agent, or Firm—Brumbaugh, Graves, Donohue & Raymond

[57] ABSTRACT

Provided is a plasma processing apparatus and method which has a plasma generating chamber into which gas is introduced and microwaves are transmitted, thereby generating plasma. The plasma is introduced into a processing chamber, in which a semiconductor substrate to be processed resides. An RF generator and DC generator are mixed together and are synchronized with the microwaves, such that they are applied to the substrate at the same times the microwaves act upon the gas to form plasma. Thus, variance of the DC bias and RF bias can be independently controlled, and damage to the substrate is reduced. In another embodiment, an RF bias voltage modulation circuit is used to shape the RF waveform in accordance with predetermined patterns.

12 Claims, 6 Drawing Sheets

PLASMA PROCESS APPARATUS AND PLASMA PROCESSING METHOD

BACKGROUND OF THE INVENTION

The present invention generally relates to a plasma processing apparatus and a plasma processing method for effecting surface treatment such as dry etching or formation of a thin film by means of CVD (Chemical Vapor Deposition) by utilizing microwave plasma in the production of semiconductor devices, and more particularly to a plasma processing apparatus and a plasma processing method for effecting surface treatment by applying RF bias voltage to a substrate to be processed.

In a plasma processing apparatus for effecting etching or thin-film formation on a substrate in order to produce semiconductor devices, it is required to arbitrarily control, at the time of etching, the anisotropy of etching, damage to the substrate surface, and the processing speed of etching, and, at the time of thin-film formation, the composition of the film such as the state of coupling between atoms, film quality such as water permeability, stress imparted to the film, and step coverage, respectively. However, it is not easy to realize an apparatus having performance that simultaneously satisfies these various conditions. In recent years, a microwave plasma processing apparatus which employs ECR (Electron Cycrotron Resonance) plasma has attracted much attention as an apparatus having the possibility of satisfying these conditions. The ECR plasma is based on such a principle that the electrons are accelerated by making use of resonance effects created between a magnetic field and microwaves, and a gas is ionized by using kinetic energy of the electrons, thereby generating the plasma. The electrons excited by the microwaves make circular motions around the lines of magnetic force. In this case, a condition under which the centrifugal force equilibrates with the Lorentz force is referred to as an ECR condition. Let the centrifugal force be $mr\omega^2$ and the Lorentz force be $-qr\omega B$, then the condition of their equilibrium is expressed as $\omega/B = q/m$, where $\omega$ is the angular frequency of the microwave, B is the density of magnetic flux and $q/m$ is the specific charge. A commonly used frequency of microwave is 2.45 GHz which is industrially certified. In this case, the resonance magnetic flux density is 875 gausses.

The ECR plasma etching/CVD apparatus requires a step of transforming the microwave into pulses having a large peak power preparatory to the impression thereof, which microwaves are introduced into the plasma generating chamber to generate the plasma, for the purpose of effecting highly efficient etching or forming the thin film by providing a high density of plasma. Besides, it is a common practice that the RF bias voltage is applied between the plasma and the substrate to be processed in order to perform the processing with high anisotropy in the etching processing. Note that RF is an abbreviation of Radio Frequency and this is referred to as a high frequency ranging from approximately 50 Khz to several tens of Mhz. As in the case of etching process, grooves and holes formed in the substrate surface can be embedded uniformly with a highly dense film by applying the RF bias voltage when forming the thin film. In addition, if the substrate surface is formed with stepped portions, these stepped portions can be eliminated to form a level surface. The reason for this is as follows: When plasma is generated, the so-called floating potential is produced on the substrate surface (or the surface of the thin film formed on the substrate surface) owing to a difference in the mobility of electrons and ions that are present in the plasma, but if RF bias voltage is applied thereto, the magnitude of this floating potential can be controlled, so that it is possible to control the energy of ions directed toward the substrate surface or the thin-film surface. In addition, conceivable as another reason is that when RF bias voltage is applied, the electric fields are produced not only in the vertical direction to the substrate but also in the lateral direction; this effectively acts on the formation of thin film; and the concentration of electric fields facilitates the scraping of pointed portions on the substrate surface.

As the above-described ECR plasma etching/CVD apparatus, one shown in FIG. 9 is known, for example. An outline of the configuration and operation of this apparatus will be described hereinunder. First, a plasma generating chamber 3 and a processing chamber 9 are evacuated by unillustrated evacuating means. $N_2$ gas is made to flow from gas supplying means 4 into the plasma generating chamber 3, at which time the pulse-like microwaves generated by a microwave generator 17 are introduced via a waveguide 1 serving as transferring means thereof into the plasma generating chamber 3. Provided between the plasma generating chamber 3 and the waveguide 1 is a vacuum window 2 for isolating in an airtight manner the evacuated plasma generating chamber 3 from the waveguide 1 under an atmospheric pressure. The lower portion of the plasma generating chamber 3 is fitted with a metallic plate centrally formed with an opening 7 having a large diameter. The metallic plate and the plasma generating chamber 3 are combined to constitute a half-open microwave resonator. Disposed outside the resonator is an excitation solenoid 6 by which magnetic fields satisfying ECR conditions are produced in the resonator. As a result, the plasma is generated in the resonator. The plasma is forced out into the processing chamber 9 along a transfer path 13 formed by magnetic force. Subsequently, for instance, monosilane gas ($SiH_4$) is fed from gas supplying means 12 into a space extending to a substrate board 10. Immediately when this gas is activated by the plasma, an active species reacts on a substrate 11 to be processed, to which the RF bias voltage is applied from the RF generator 20, whereby a thin film is formed on the substrate surface. Note that a wire for applying the RF bias voltage to the substrate 11 is covered with a shield of an earth potential, and the peripheral surface of the substrate 11 is surrounded with the shield of the earth potential.

The ECR plasma etching/CVD apparatus is also usable for etching on the substrate by feeding a gas for etching from the gas supplying means 4 instead of $N_2$ gas.

The following problems are, however, inherent in this type of conventional ECR plasma etching/CVD apparatus. The plasma is generated when the microwaves are introduced into the plasma generating chamber. Hence, when microwave are not generated in between pulse cycles, plasma is not produced. In the case of applying the RF bias voltage, the plasma becomes a load during the occurrence of plasma, and impedance matching is thereby possible. It is therefore possible to apply an adequate voltage onto the substrate. Where no microwave and hence no plasma is generated, however, when seen from the RF generator 20, there is created a no-load state, and the impedance cannot be matched. Meanwhile, if the RF bias voltage is previously adjusted to provide the matching during the occurrence of plasma, the impedance is inevitably mismatched when plasma is not generated, thereby applying a high voltage onto the substrate. This high voltage is in some cases approximately 1 Kv, and electric discharge takes place on the substrate surface. As a result, a first problem arises wherein craters are formed in the substrate surface and breakage results.

In addition, we found that the apparatus also had the following second problem, after having carried out various experiments on plasma processing. While plasma is being generated, the floating potential is produced on the substrate surface, as described above. This floating potential is controlled by the RF bias voltage, and is also dependent on the impedance of the plasma (determined substantially by the electric power of the microwaves supplied) when the RF bias voltage is being applied. Accordingly, when conducting the surface treatment of the substrate by means of ions in the plasma under the action of the electric power of certain microwaves, if an attempt is made to obtain an optimum value of floating potential (i.e., a mean value in time: Since it is difficult for ions in the plasma to follow the RF that is high frequency wave, the mean value in time of the floating potential becomes an issue when the RF bias voltage is being applied), the value (peak value) of the RF bias voltage is unconditionally set at a certain value. Meanwhile, in various types of processing, there are cases where the optimum value (mean value) of the floating potential controlled by this RF bias voltage does not agree with the optimum value (peak value) of the RF bias voltage itself for bringing about that value. That is, if the peak value of the RF bias voltage is set to be a value which produces the floating potential as an optimum mean value, there are cases where the peak value itself of the RF bias voltage becomes an inadequate value. As a result, conditions of processing at the time of effecting the etching or CVD process become difficult to simultaneously satisfy desired processing characteristics of various types, so that there has been a problem in that the results of processing are difficult to control. For instance, in the formation of a thin film, there are cases where even if the peak value of the RF bias voltage is an optimum value with respect to the film quality, stress applied to the film becomes excessively large. In addition, similarly in the etching process as well, there are cases where even if the peak value of the RF bias voltage is an optimum one for improving anisotropy, damage to the substrate surface becomes large due to the sputtering of ions in the plasma.

Accordingly, as an ECR plasma etching/CVD apparatus for overcoming the first problem as described above, an apparatus invented by the same inventors of the present invention and patented earlier in the United States (U.S. Pat. No. 4,891,118, issues Jan. 2, 1990) is shown in FIG. 10. An outline of the arrangement and operation of this apparatus will be described hereinunder.

Those members that are identical with those of FIG. 9 are denoted by the same reference numerals, and a description thereof will be omitted.

In the apparatus shown in FIG. 10, the application of RF bias voltage to a substrate 11 is effected by a synchronization pulse generating circuit 22 in synchronism with the pulses of microwaves. During a time interval when the microwaves are not being produced during pulse cycles of the microwaves, the RF bias voltage is not applied to the substrate.

Hence, in accordance with this apparatus, it is possible to overcome the first problem of the apparatus shown in FIG. 9, i.e., the problem that a high voltage is continuously applied to the substrate, discharge takes place on the substrate surface, and craters are produced in the substrate surface, resulting in breakage.

However, the second problem of the apparatus shown in FIG. 9 cannot be solved by the ECR plasma etching/CVD apparatus shown in FIG. 10. A more detailed explanation will be given of this second problem which was found by the inventors.

As described above, it is only when the microwaves have been introduced into the plasma generating chamber that the plasma is generated. Hence, the RF bias voltage is applied only when the plasma is being generated in the pulse cycles of the microwaves, whereby impedance matching is made with the plasma acting as load, and an adequate voltage is applied to the substrate. With the apparatus shown in FIG. 10, however, the time width for the application of the RF bias voltage at this time is identical with the time width of the microwave pulses, and its magnitude is fixed. If, for instance, an attempt is made to increase the RF bias voltage to be applied to the substrate so as to obtain desired film quality, a high voltage must be output from the RF generator for a time width identical with that of microwave pulses. However, as described above, there are cases where the optimum value as a mean value of the floating potential controlled by the RF bias voltage does not agree with the optimum peak value of the RF bias voltage itself for producing that value. For that reason, in the arrangement as shown in FIG. 10, in which the RF bias voltage of a fixed magnitude is merely generated for the same time width as that of the microwave pulses, although it may be optimum for producing predetermined floating potential, the RF bias voltage itself having a peak value of the magnitude greater than that optimum value must be applied for a long time more than is necessary. As a result, it is impossible to simultaneously satisfy the desired processing characteristics of various types. A specific example of it will be described below.

When forming a thin film on the substrate, for instance, in order to improve the step coverage in the stepped portions of the substrate surface, it is necessary to increase the RF bias voltage to be applied, set the magnitude of floating potential produced on the substrate above a certain threshold value, and deposit a thin film on side walls of the stepped portions by means of the sputtering effect using ions. However, the value of the floating voltage controlled by the RF bias voltage and accelerating the sputtering phenomenon with respect to ions is a mean value in time, as mentioned before. In contrast, the potential which actually appears on the substrate has a relatively large amplitude (peak). Consequently, if an attempt is made to set the peak value of the RF bias voltage applied with a fixed magnitude for the same time width as that of microwave pulses in such a manner as to be a large value so as to create a sufficient value (mean value) of floating potential for producing the sputtering effect, inside the so called sheath which is present between the plasma and the substrate surface, the acceleration and deceleration of the electrons and ions are repeated throughout that time width, and the film quality and the magnitude of stress applied to the film change. As a result, if the RF bias voltage with a large amplitude is applied for a long time more than is necessary, there occurs a case where the film quality and the stress applied to the film do not become adequate. In particular, when forming a thin film of silicon nitride, the stress in the film is liable to be excessively large.

A first object of the present invention is to provide a plasma processing apparatus in which a mean value of floating potential occurring on a substrate surface to be processed can be controlled to a desired value in a wide range, the composition of film, film quality, and stress applied to the film can be arbitrarily controlled in the formation of thin film, and anisotropy, damage to the film, and processing speed can be arbitrarily controlled in etching.

A second object of the present invention is to provide a plasma processing method which is capable of controlling the aforementioned various characteristics in thin film formation or etching, and more particularly to provide a plasma processing method suitable for making adequate the composition of film, film quality, and stress applied to the film in thin film formation and for rendering favorable step coverage realizable.

SUMMARY OF THE INVENTION

To attain the aforementioned first object, in accordance with the present invention, there is provided a plasma processing apparatus comprising: means for generating pulse-like microwaves; means for transferring the microwaves; a plasma generating chamber connected to the microwave transferring means to introduce the microwaves and providing an excitation solenoid for generating lines of magnetic force by which to produce active atoms, molecules or ions by transforming a gas supplied by gas supplying means into plasma by dint of resonance effects with the microwaves, the plasma generating chamber being formed with an opening coaxial with a central axis of a flux of the lines of magnetic force which is generated by the solenoid, the opening being disposed vis-a-vis with the microwave transferring means; a processing chamber communicating via the opening with the plasma generating chamber and provided with a substrate on the surface of which a thin film is formed, or the surface of which is etched by the active atoms, molecules or ions flowing out of the opening along the lines of magnetic force; RF generating means for applying an RF bias voltage to the substrate; and evacuating means for evacuating the plasma generating chamber and the processing chamber, characterized by comprising: DC generating means for applying DC bias voltage in addition to the RF bias voltage; synchronizing means for synchronizing a timing at which the pulse-like microwaves, the RF bias voltage, and the DC bias voltage are generated; and mixing means for applying the RF bias voltage and the DC bias voltage to the substrate without any interference.

In addition, to attain the aforementioned second object, in accordance with the present invention, there is provided a plasma processing method wherein pulse-like microwaves are introduced into a vacuum vessel where a DC magnetic field is produced, a gas introduced into the vacuum vessel is transformed into plasma by means of a resonance effect between the DC magnetic field and the microwaves, and etching is provided on a substrate which is disposed in a transfer path of the plasma and to which RF bias voltage is applied or a thin film is formed on the substrate while the plasma is being transferred along the DC magnetic field, comprising the steps of: applying the RF bias voltage to the substrate in synchronism with the pulse-like microwaves; and effecting surface treatment while the magnitude of the RF bias voltage is being changed with time in accordance with a predetermined change within a pulse width of the microwaves.

By simultaneously applying the RF bias voltage and the DC bias voltage to the substrate, it becomes possible to not only cause processing conditions to agree with desired conditions but also widen the scope of processing conditions. That is, the substrate, when the bias voltage is applied thereto, displays such a voltage that causes the aggregate amount of charge on the substrate to become zero. Hence, in a case where only the RF bias voltage is first applied to the substrate, even if charges are liable to be accumulated on the substrate due to a difference in mobility between positively charged particles and negatively charged particles reaching the substrate, the center of the waveform of the oscillating potential on the substrate moves in such a manner as to make this accumulation zero. This central potential, i.e., floating potential, varies depending on the magnitude of the RF bias voltage, since the RF bias voltage is being applied, it also depends on the impedance of the plasma. If the DC bias voltage is further applied to the substrate whose floating potential is thus determined, the potential of the substrate further moves in such a manner as to make the accumulated changes zero with this DC bias voltage applied. Accordingly, by independently changing the respective magnitudes of the DC bias voltage and the RF bias voltage, it becomes possible to control the value of the floating potential in a wide range, with the result that it is possible to expand the processing conditions at the time of film formation or etching.

In other words, if the floating potential is controlled by the RF bias voltage, the floating potential sensed by the ions involved in the processing of the substrate is a mean value in time. However, the RF bias voltage having, for instance, a large amplitude (peak) is applied to the substrate surface. Since, with regard to various processing characteristics, there are cases where an optimum value (peak value) of the RF bias voltage and an optimum value (mean value) of the floating potential resulting from the application of the RF bias voltage do not agree with each other, the film quality and the like may be adversely affected by the RF bias voltage having such a large peak. However, if the DC bias voltage is also applied simultaneously, the mean value of the floating potential can be shifted independently of the RF bias voltage thanks to the action of the DC bias voltage inherent in itself. Accordingly, by simply applying the RF bias voltage with a small peak value, it is possible to produce the floating potential (mean value) equivalent to that of a case where the RF bias voltage having a large peak is applied. Conversely, it is possible to make the value (mean value) of the floating potential small when it is desirous to apply the RF bias voltage having the large peak value. Hence. both the mean value of the floating potential and the peak value of the RF bias voltage can be made optimum values simultaneously.

Furthermore, if the synchronization with pulse-like microwaves is effected for the RF bias voltage only, and the DC bias voltage is continuously applied to the substrate, the potential of the substrate moves in the same as when the RF bias voltage is applied when the plasma is not being generated, so that there are cases where the substrate surface may be damaged depending on the magnitude of the DC bias voltage. Consequently, there arises a problem in that the magnitude of the DC bias voltage applied to the substrate is restricted, thereby making the scope of the processing conditions small. In the present invention, however, both the RF bias voltage and the DC bias voltage are applied in synchronism with the pulse-like microwaves and no RF bias voltage nor DC bias voltage is applied to the substrate when the plasma is not present in the plasma generating chamber, so that the substrate surface is prevented from becoming damaged.

Then, it is possible to widen the scope of processing conditions while preventing the discharge on the substrate by adopting a surface treatment method wherein the RF bias voltage to be applied to the substrate is generated in synchronism with the pulse-like microwaves, and surface treatment is effected while the magnitude of the RF bias voltage is being varied with time in accordance with a predetermined change within a pulse width of microwave. In other words, at the time of film formation or the like, even if it is desirous to supply the RF bias voltage with a large peak for obtaining sufficient floating potential (mean value) it is impossible to obtain sufficient floating potential under the condition in which the RF bias voltage can be applied, so that there occur cases where the desired film quality cannot be obtained. In such cases, if RF bias voltage having a shorter time width in the peak value than the pulse width of microwave is applied, it is possible to apply the RF bias voltage with a large peak value without increasing the average electric power. For instance, a thin-film substance deposited on the groove entrance surfaces in such a manner as to block the groove entrances, which prevent the formation of a dense film on the side surfaces of grooves of a submicron width can be sputtered into the grooves, thereby making it possible to improve the film quality without increasing the average electric power from the RF generator.

In other words, as described above, in order to allow the thin film to be deposited with good step coverage on the side surfaces of the grooves, i.e., stepped portions, it is necessary to make the RF bias voltage to be applied into one with a large peak and increase the mean value in time of the floating potential so as to enhance the sputtering effect by means of ions. However, the sputtering effect is not produced unless ions accelerated by acceleration voltage (in this case the floating potential corresponds to the acceleration voltage) above a certain threshold value are used. This threshold value is several tens of volts although it varies depending on the material to be sputtered. If the RF bias voltage of a magnitude for which this sputtering effect can be sufficiently expected is continuously applied to the substrate, there are cases where stress applied to the film becomes an issue. However, a sufficient sputtering effect can be realized without the occurrence of the issue of stress if the average electric power for RF bias is checked to a low level, and the peak value of the RF bias voltage is increased during a short time so that the mean value in time of the floating potential becomes large during that short time only, as described above.

Thus, in accordance with the method of the present invention, it is possible to freely control the film quality without causing breakage to the substrate surface or increasing the mean value of the RF electric power, and the optimization of processing conditions becomes readily possible

DESCRIPTION OF THE PREFERRED EMBODIMENTS

Figure 1:
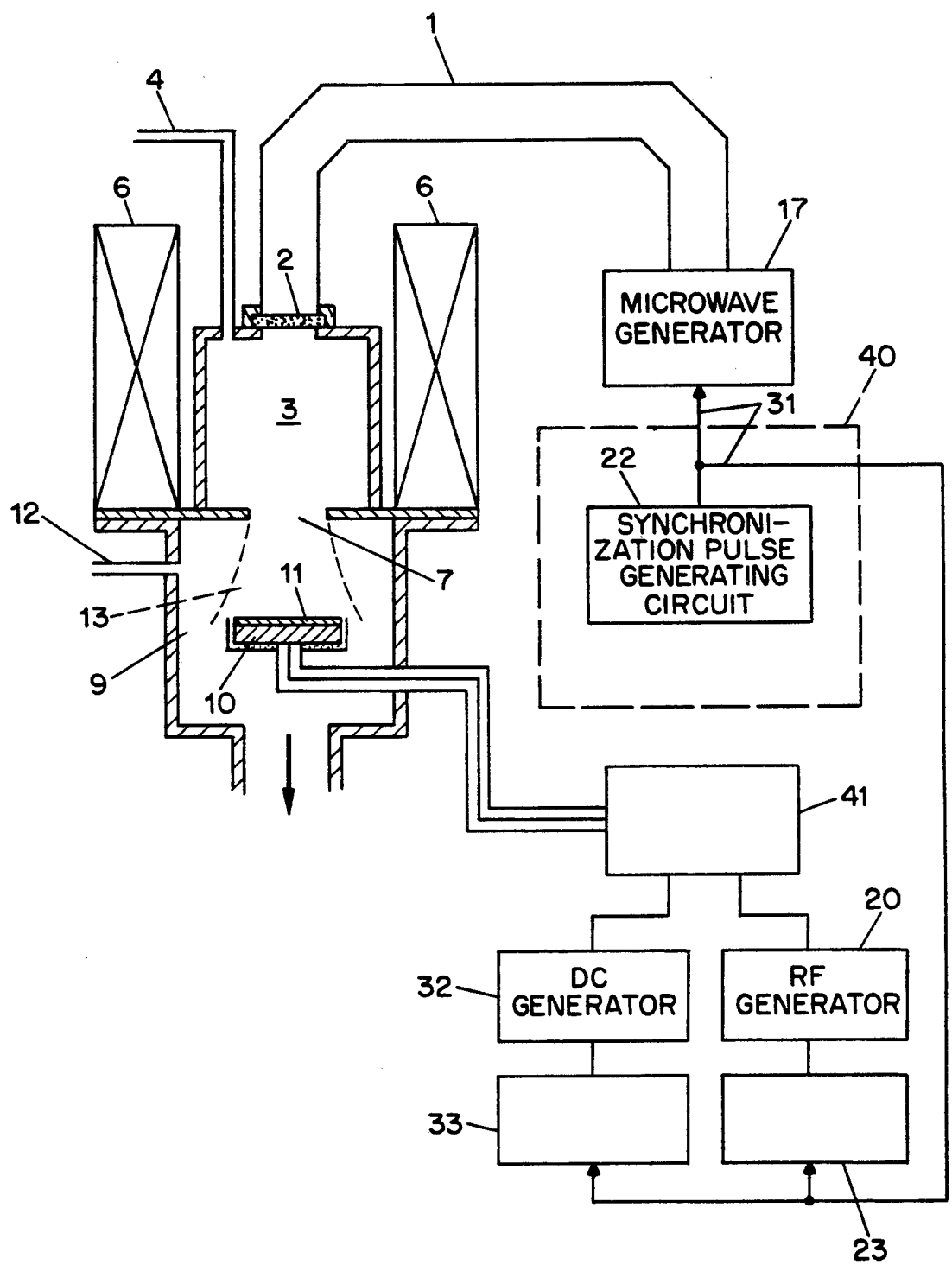
FIG. 1 is a schematic diagram of a plasma processing apparatus in accordance with an embodiment of the present invention.
Figure 2:
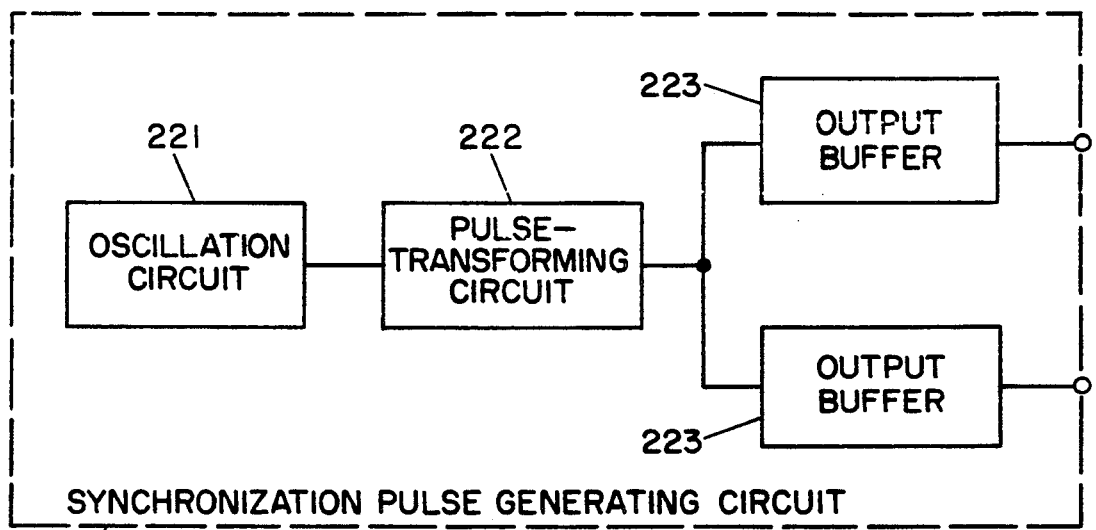
FIG. 2 is a block diagram illustrating a configuration of a synchronization generating circuit constituting the synchronization means.
Figure 3:
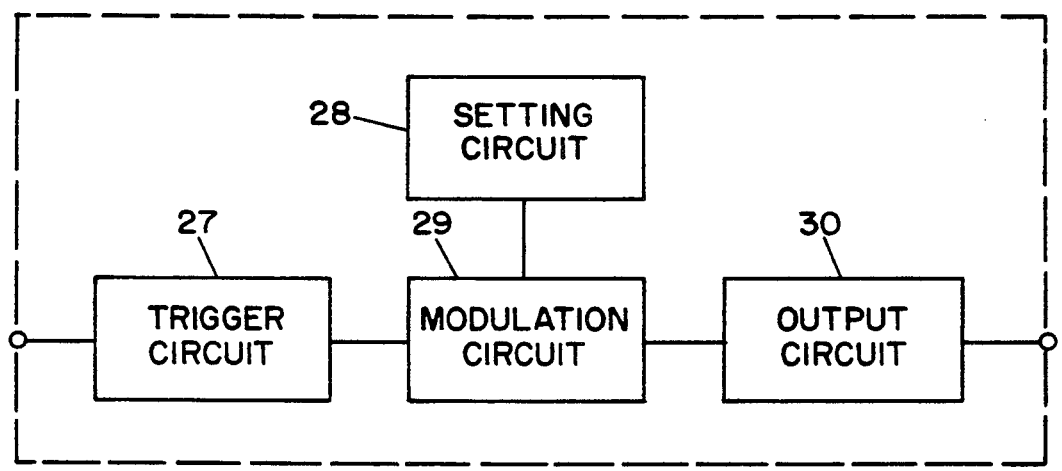
FIG. 3 is a block diagram illustrating circuit configurations of an RF bias modulation circuit and a DC bias modulation circuit.
Figure 10:
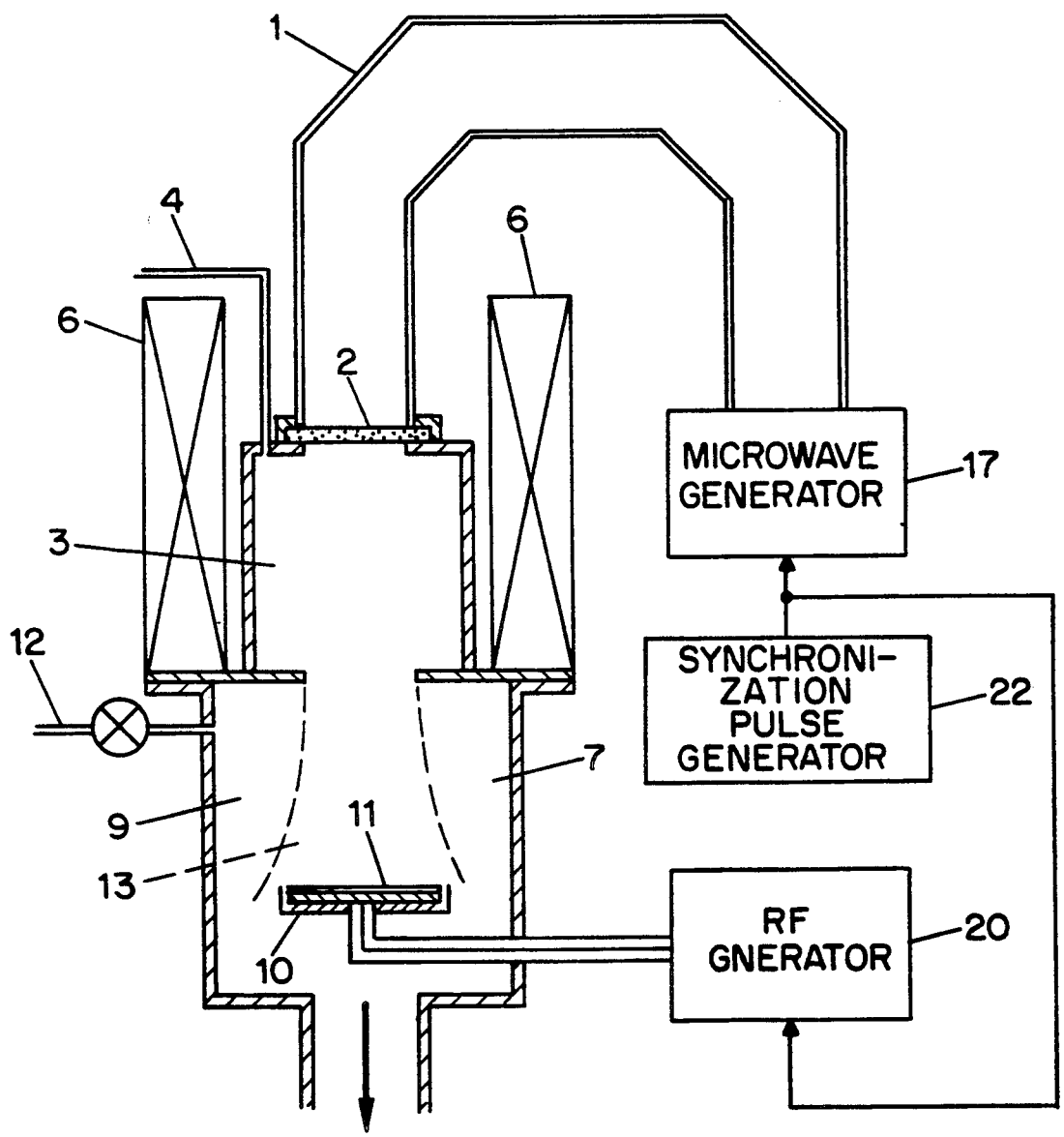
FIG. 10 is a schematic diagram of a microwave plasma processing apparatus invented by the same inventors as the present invention and patented earlier in the United States (U.S. Pat. No. 4,891,118 issued on Jan. 2, 1990).

Referring now to FIG. 1, there is illustrated an embodiment of an ECR plasma etching/CVD apparatus conceived as a plasma processing apparatus constructed in accordance with the present invention. The same members that are identical with those in FIG. 10 are denoted by the same reference numerals, and a description thereof will be omitted. In FIG. 1, optimizing means shown as a synchronizing means 40 for synchronizing a timing at which pulse-like microwaves, RF bias voltage and DC bias voltage are generated comprises a synchronization pulse generating circuit 22 and pulse signal transmitting means 31. FIG. 2 is a block diagram illustrating the synchronization pulse generating circuit 22. An oscillation circuit 221 serves to generate an alternating current at a frequency of 100 Hz or thereabouts. The alternating current is transformed into rectangular waves by means of a pulse-transforming circuit 222. The rectangular waves are transmitted by pulse signal transmitting means 31 to a microwave generator 17 via an output buffer 223 having a current amplifying function and comprising operational amplifiers and an IC, thereby generating microwaves. At the same time, the rectangular waves are input to an RF bias modulation circuit 23 and a DC bias modulation circuit 33, and a desired waveform, i.e., RF bias voltage and DC bias voltage each having a certain magnitude in this case, are respectively output from the RF generator 20 and a DC generator 32 simultaneously with the microwaves on the basis of the outputs from the modulation circuits 22, 23. The RF bias modulation circuit 23 and the DC bias modulation circuit 33 are respectively provided with the circuit configuration shown in FIG. 3. Specifically, by inputting the rectangular waves to a trigger circuit 27, the bias modulation circuit is started, data which has been preset in a setting circuit 28 is input as electric signal from a modulation circuit 29 to the RF generator 20 or the DC generator 32 in ensuing stages via an output circuit 30. Then, a desired waveform, i.e., a bias voltage of a desired magnitude in this case, is generated from the RF generator 20 and the DC generator 32, respectively, simultaneously with the microwaves and is input to an RF/DC bias mixing circuit 41.

Figure 4A:
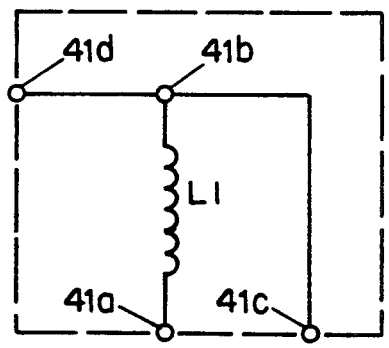
FIG. 4(a) and (b) is a circuit diagram illustrating an example of a configuration of an RF/DC bias mixing circuit.
Figure 4B:
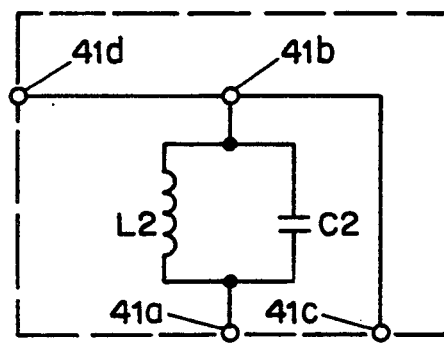

The RF/DC bias mixing circuit 41 is configured as an inductance $L_1$ whose input-side terminal 41a is connected to an output terminal of the DC generator 32 and whose output-side terminal 41b is connected an output terminal of the RF generator 20 via an input terminal 41C of this circuit, as shown in FIG. 4(a), or as a parallel resonance circuit resonating with the frequency of RF waves and comprising an inductance $L_2$ and a capacitor $C_2$ instead of the inductance $L_1$, as shown in FIG. 4(b). The RF/DC bias mixing circuit 41 serve to lead the DC bias voltage and the RF bias voltage to the substrate without any interference.

As a result of adopting the above-described configuration, in the plasma processing apparatus in this embodiment, it becomes possible to independently control the RF bias voltage and the DC bias voltage, and it becomes possible to control the mean value of the floating potential independently of the peak value of the RF bias voltage.

Figure 5:
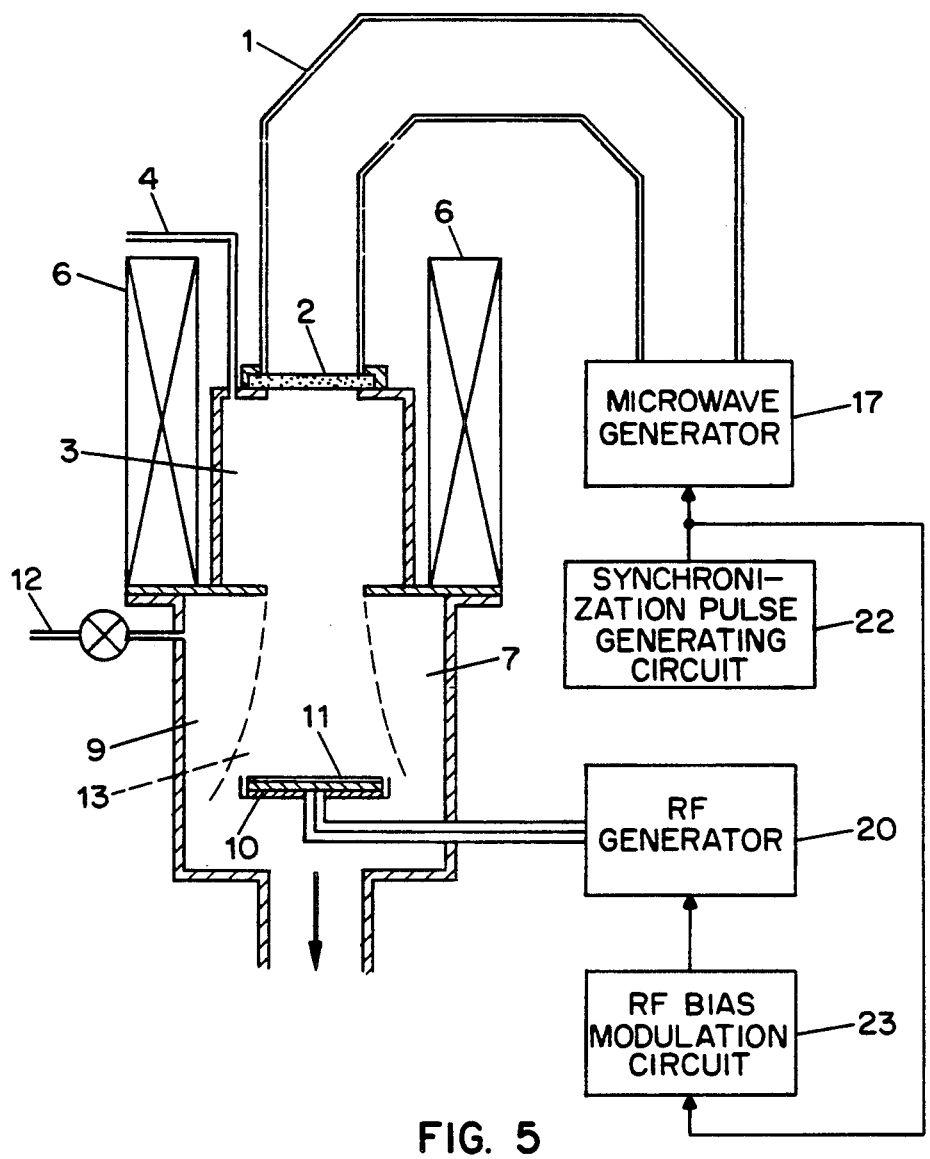
FIG. 5 is a schematic diagram illustrating an embodiment of a configuration of a microwave plasma processing method of the present invention.

FIG. 5 shows an embodiment of an arrangement of the microwave plasma processing apparatus for enabling a plasma processing method in accordance with the present invention. In FIG. 5, members that are identical with those of FIG. 10 are denoted by the same reference numerals, and a description thereof will be omitted.

Figure 6:
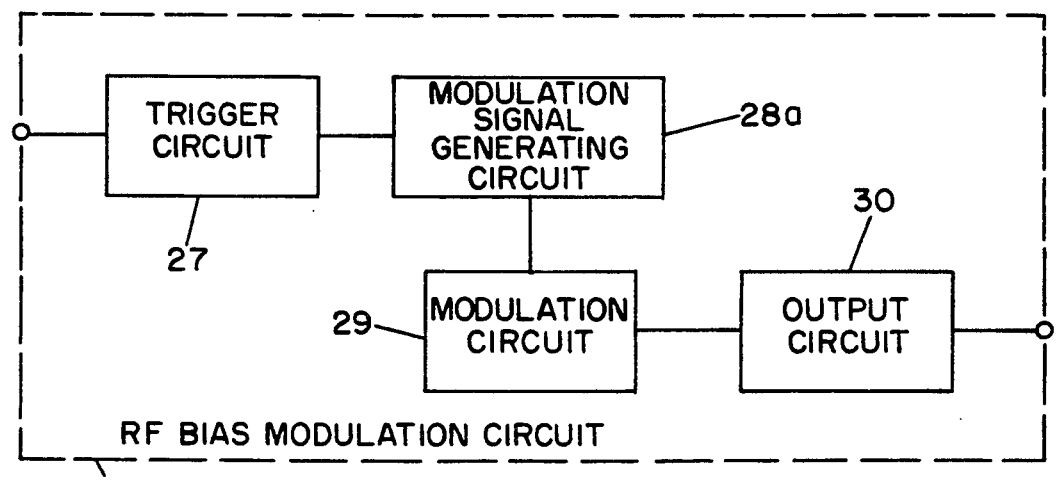
FIG. 6 is a block diagram illustrating a circuit configuration of the RF bias modulation circuit shown in FIG. 5.

The synchronization pulse generating circuit 22 for synchronizing the application of the RF bias voltage to the substrate 11 with pulse-like microwaves has the same arrangement as that shown in FIG. 2, and transmits rectangular waves to the microwave generator 17 and the RF bias modulation circuit 23 via the output buffer 223. A voltage whose magnitude varies with a predetermined change in time is output from the RF bias modulation circuit 23 and is input to the RF generator 20, and a modulated RF voltage whose magnitude changes in accordance with an input change in time is output from the RF generator 20. As shown in the block diagram shown in FIG. 6, the RF bias modulation circuit 23 comprises the trigger circuit 27, a modulation signal generating circuit 28a, the modulating circuit 29, and the output circuit 30. By inputting the rectangular waves output from the synchronization pulse generating circuit 22 to the trigger circuit 27, the modulation signal generating circuit 28a is started in synchronism with the microwave pulses, and a signal voltage whose magnitude changes in accordance with a predetermined change in time is input to the modulation circuit 29. The waveform formed by the modulation circuit 29 is input to the RF generator 20 via the output circuit 30 having a current amplifying function, and the RF voltage whose magnitude varies in accordance with a predetermined change in time in synchronism with the microwave pulses is output from the RF generator 20. It should be noted that the RF bias modulation circuit shown in FIG. 6 is slightly different from the one shown in FIG. 3, and is capable of making the waveform of the RF voltage a more complex one by virtue of the function of the modulation signal generating circuit 28a.

Figure 7:
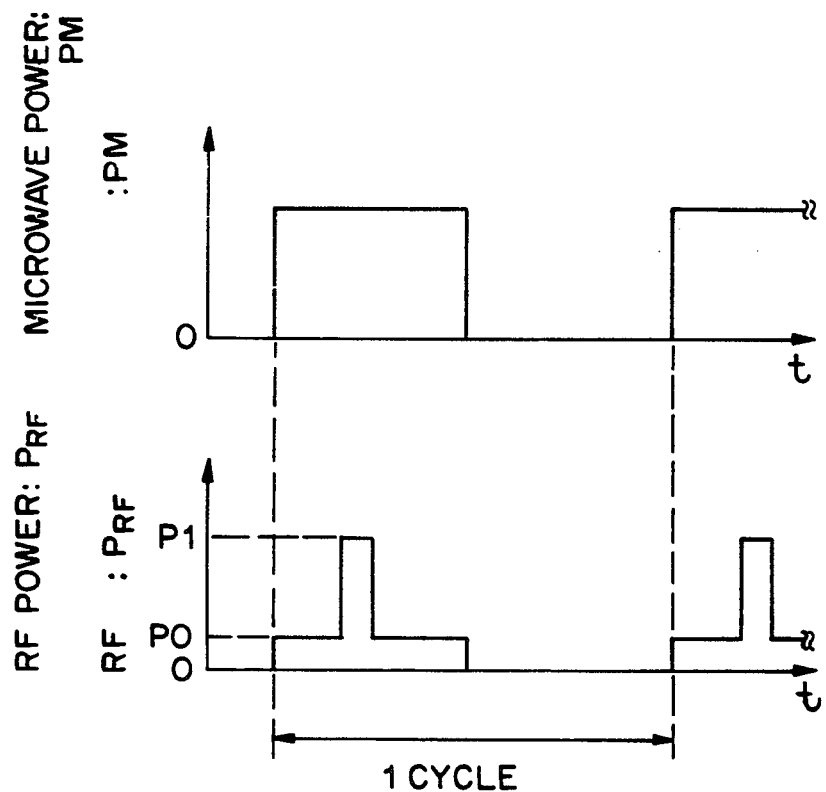
FIGS. 7 and 8 are diagrams illustrating changes in time of RF power output from the RF generator in synchronism with pulse-like microwaves, respectively.
Figure 8:
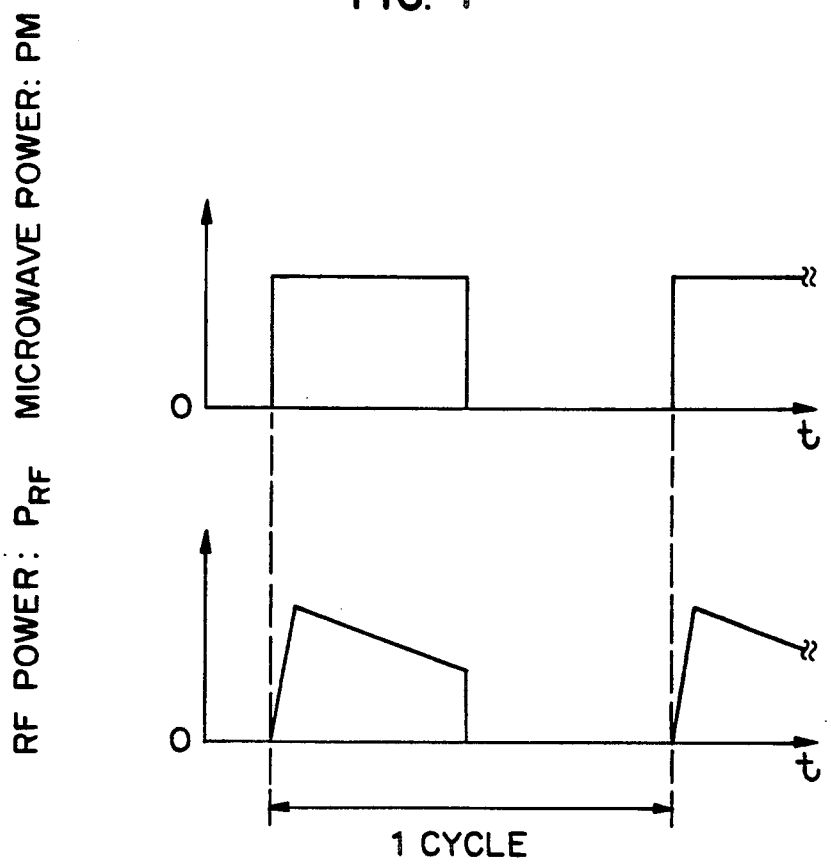
Figure 9:
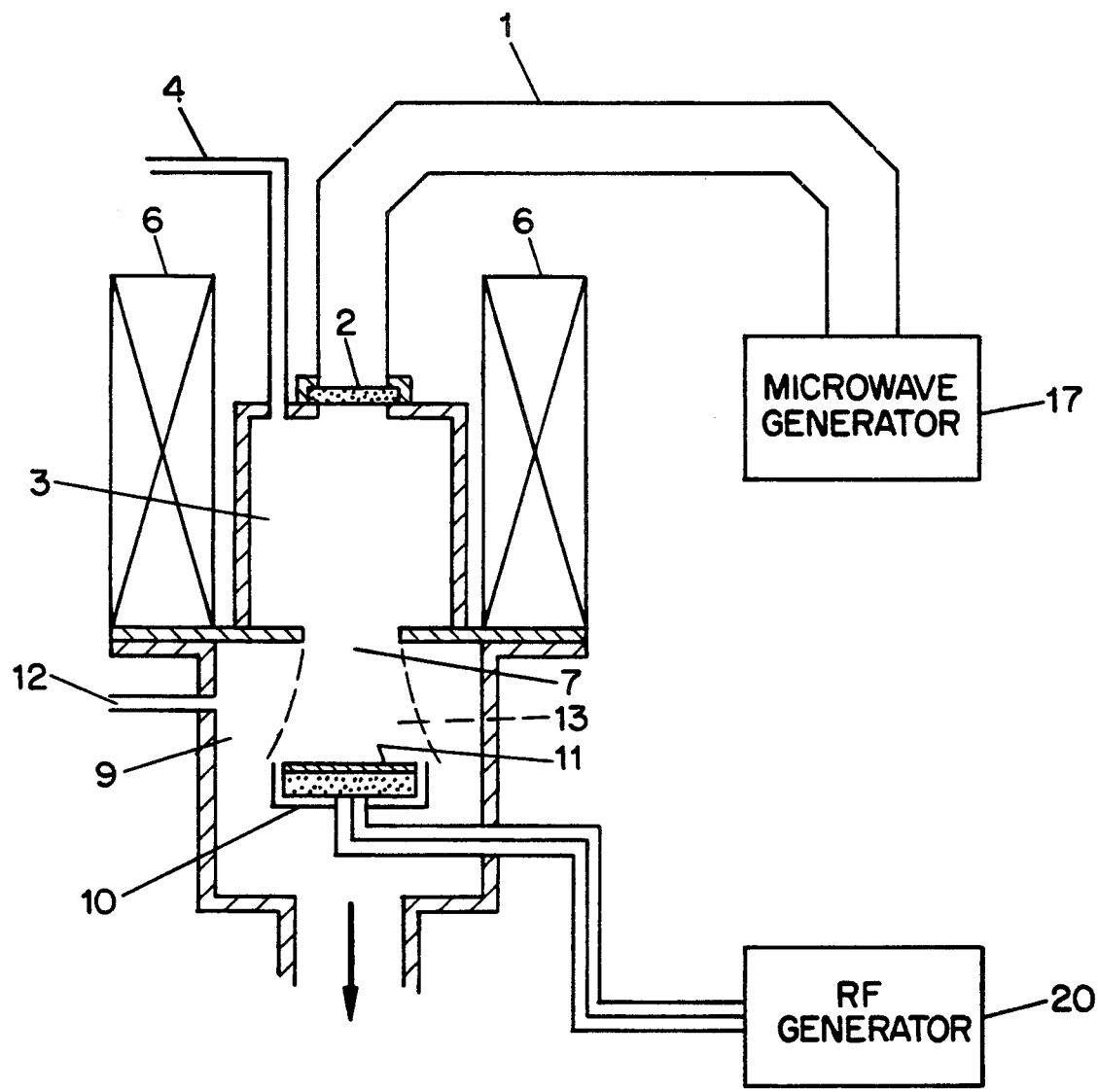
FIG. 9 is a schematic diagram of a conventional RF bias voltage application-type plasma processing apparatus.

FIGS. 7 and 8 illustrate examples of a change in time of the RF electric power output from the RF generator 20 in synchronism with the microwave pulses.

FIG. 7 illustrates a case in which a thin film is formed on the substrate surface as electric power in which a base portion $P_0$ of the RF electric power necessary for a predetermined film-forming rate changes to peak power $P_1$ during a short time is output from the RF generator 20 (FIG. 5) during a time interval when microwaves during one cycle of microwave pulses are being generated, in synchronism with pulse-like microwaves having large peak power for efficient etching or thin-film formation. When peak power P1 with a high crest value (a value allowing the sputtering effect to be produced) is output, a high RF bias voltage is applied to the substrate 11, with the result that the floating potential on the substrate becomes large during a time when the peak power Pl is being output. Consequently, a thin-film substance deposited on stepped portions of the substrate surface in such a manner as to project laterally on the surfaces of projecting portions is sputtered by ions contained in the plasma or by an active species accelerated by being prompted by the ions, and the formation of the film on the recessed portions and side wall portions is subsequently carried out without being hampered by the deposited substance on the projecting portions. Thus, it is possible to form a thin film having a uniform film thickness and excellent step coverage on the entire stepped portions and side wall surfaces without increasing the mean power output from the RF generator 20. That is, as a result of adopting the method of the present invention, it is readily possible to form a silicon nitride film (an insulating film and is also used as a passivation film or the like) concerning which the problem of stress applied to the film has been particularly noticeable when the RF bias voltage for producing floating potential whereby the sputtering effect is sufficiently expectable is continuously applied to the substrate. In addition, since the application of the RF bias voltage to the substrate 11 is effected within the time interval when the microwaves are being generated, a high voltage based on the mismatching of impedance between the RF generator side and the plasma side is prevented from appearing on the substrate surface, and discharge on the substrate surface does not occur, so that the damage to the substrate surface does not result.

FIG. 8 illustrates a case of a change in time wherein the RF power, which is produced during the time interval when the microwaves are being generated during one cycle of microwave pulses, rises in an inclined manner, and gradually attenuates with time. By adopting such a change in time, it is possible to prevent the nonuniformity of the RF bias voltage due to drooping and the like of a change in time of a DC cutting capacitor, although not particularly shown in FIG. 5, which is interposed between a substrate base 10 and the RF generator 20, thereby making it possible to form a film under film-forming conditions that are free from variation.

As described above, in accordance with the present invention, the ECR plasma etching/CVD apparatus is so arranged as to comprise DC generating means for applying DC bias voltage in addition to the RF bias voltage; synchronizing means for synchronizing a timing at which the pulse-like microwaves, the RF bias voltage, and the DC bias voltage are generated; and mixing means for applying the RF bias voltage and the DC bias voltage to the substrate without any interference, the arrangement provided being such that the RF bias voltage and the DC bias voltage are applied to the substrate in synchronism with the pulse-like microwaves. Therefore, both the RF bias voltage and the DC bias voltage are applied to the substrate only when the microwaves have been introduced into the plasma generating chamber and the plasma is being generated, thereby preventing damage to the substrate surface. In addition, it is possible to arbitrarily control the floating potential produced on the substrate by independently adjusting the respective magnitudes of the RF bias voltage and the DC bias voltage, so that it is possible to vary in a wide range the processing conditions at the time of forming a thin film on the substrate or providing etching thereon. Thus, it is possible to obtain an advantage in that substrate processing under optimal conditions becomes possible. Accordingly, in the formation of a thin film, it is possible to simultaneously control the composition of the film, film quality, stress applied to the film, and the like to have desired characteristics. In the etching process, on the other hand, it is possible to simultaneously control the anisotropy, damage applied to the film, and the processing speed, as desired.

In addition, in accordance with the present invention, a plasma processing method is adopted wherein pulse-like microwaves are introduced into a vacuum vessel where a DC magnetic field is produced, a gas introduced into the vacuum vessel is transformed into plasma by means of a resonance effect between the DC magnetic field and the microwaves, and etching is provided on a substrate which is disposed in a transfer path of the plasma and to which RF bias voltage is applied or a thin film is formed on the substrate while the plasma is being transferred along the DC magnetic field. The method comprises the steps of: applying the RF bias voltage to the substrate in synchronism with the pulse-like microwaves; and effecting surface treatment while the magnitude of the RF bias voltage is being changed with time in accordance with a predetermined change within a pulse width of the microwaves. Accordingly, a high voltage is prevented from being applied to the substrate surface continuously, so that it becomes possible to effect etching a formation of a thin film by applying an optimal RF bias voltage to the substrate. Moreover, without increasing mean electric power output from the RF generator, it becomes possible to effect surface treatment which allows film quality control to be conducted in a wide range by applying to the substrate the RF bias voltage changing in time in correspondence with the targeted film-quality formation.

Hence, in accordance with the plasma processing method of the present invention, it is possible to form a thin film having excellent step coverage by virtue of the sputtering effect while securing desired characteristics with respect to the film quality and the stress applied to the film.

We claim:

1. A plasma processing apparatus comprising:
   a cylindrical plasma generating chamber having openings at the opposite ends thereof;
   a cylindrical processing chamber communicating with said plasma generating chamber via the opening at one end of said plasma chamber;
   means for evacuating said plasma generating chamber and said processing chamber;
   a microwave generator for generating pulses of microwaves;
   a waveguide means for transferring said pulses of microwaves through an opening at the end of said plasma chamber;
   a means for supplying a gas into said plasma generating chamber;
   an excitation solenoid surrounding said plasma generating chamber for generating a magnetic field within said plasma chamber for transforming said gas, by resonance effects with said microwaves, into a plasma of active atoms, molecules or ions;
   support means positioned within said processing chamber for supporting a substrate to be processed in a position to be bombarded by active atoms, molecules or ions flowing out of said plasma chamber along lines of magnetic force;
   controllable means for generating an RF bias voltage to be applied to said substrate;
   controllable for generating a DC bias voltage to be applied to said substrate;
   synchronizing means for generating synchronizing signals for keying said RF bias voltage and said DC bias voltage during periods when said microwave pulses are generated; and
   mixing means, coupled to said means for generating an RF bias voltage and said means for generating a DC bias voltage, for applying the RF bias voltage and the DC bias voltage to the substrate;
   said RF bias voltage and the DC bias voltage being independently controllable for allowing variance of processing conditions, and being applied to the substrate only when the microwaves have been introduced into the plasma generating chamber and plasma is being generated, thereby preventing damage to the substrate surface.

2. A plasma processing apparatus as set forth in claim 1, wherein said synchronizing means comprises:
   a synchronization pulse generating means for generating said synchronizing signals; and
   a pulse signal transmitting means for transferring said synchronizing signals to said RF generating means, to said DC generating means, and to said microwave generator such that said RF bias voltage and said DC bias voltage are applied to said substrate in synchronism with the generation of said plasma.

3. A plasma processing apparatus as set forth in claim 2, wherein said synchronization pulse generation means comprises:
   an oscillation circuit for generating an alternating current at a predetermined frequency;
   a pulse transforming circuit, coupled to said oscillation circuit, for transforming the alternating current into rectangular waves; and
   first and second output buffers, coupled to said pulse transforming circuit, for transferring said rectangular waves to said pulse signal transmitting means.

4. A plasma processing apparatus as set forth in claim 3, wherein said means for generating an RF bias voltage comprises an RF bias modulation circuit comprising a trigger circuit for receiving the rectangular waves, a modulation circuit coupled to said trigger circuit, a setting circuit containing preset data coupled to said modulation circuit, and an output circuit; and an RF generator.

5. A plasma processing apparatus as set forth in claim 3, wherein said means for generating a DC bias voltage comprises:

a DC bias modulation circuit comprising a trigger circuit for receiving the rectangular waves, a modulation circuit coupled to said trigger circuit, a setting circuit containing preset data coupled to said modulation circuit, and an output circuit; and an DC generator.

6. A plasma processing apparatus as set forth in claim 1, wherein said mixing means comprises an inductor of a predetermined value, one lead coupled to the output of said DC generating means, and the other lead coupled to the output of said RF generating means.

7. A plasma processing apparatus as set forth in claim 6, wherein said mixing means further comprises a capacitor of predetermined value coupled across said inductor.

8. A plasma processing apparatus comprising:
a cylindrical plasma generating chamber having openings at the opposite ends thereof;
a cylindrical processing chamber communicating with said plasma generating chamber via the opening at one end of said plasma chamber;
means for evacuating said plasma generating chamber and said processing chamber;
a microwave generator for generating pulses of microwaves;
a waveguide means for transferring said pulses of microwaves through an opening at the end of said plasma chamber;
means for supplying a gas into said plasma generating chamber;
an excitation solenoid surrounding said plasma generating chamber for generating a magnetic field within said plasma chamber for transforming said gas, by resonance effects with said microwaves, into a plasma of active atoms, molecules of ions;
support means positioned within said processing chamber for supporting a substrate to be processed in a position to be bombarded by active atoms, molecules or ions flowing out of said plasma chamber along lines of magnetic force;
a controllable RF generator for generating controllable amplitudes of an RF bias voltage to be applied to said substrate;
synchronizing means for generating synchronization signals for keying said RF bias voltage during periods when said microwave pulses are generated;
RF-bias-modulation means comprising a trigger circuit, a modulation signal generating circuit, a modulating circuit, and an output circuit having a current amplifying function, said RF-bias-modulation means coupled to said synchronizing means and to said RF generator, for varying the RF bias voltage in a predetermined pattern during periods when said microwave pulses are generated; and
the amplitude of the RF bias voltage being controllable for allowing variance of processing conditions, and being applied to the substrate only when the microwaves have been introduced into the plasma generating chamber and plasma is being generated, thereby preventing damage to the substrate.

9. A plasma processing apparatus as set forth in claim 8, wherein said synchronizing means comprises:
a synchronization pulse generating means for generating said synchronizing signals; and
a pulse signal transmitting means for transferring said synchronizing signals to said RF generating means, to said DC generating means, and to said microwave generator such that said RF bias voltage and said DC bias voltage are applied to said substrate in synchronism with the generation of said plasma.

10. A plasma processing apparatus as set forth in claim 9, wherein said synchronization pulse generation means comprises:
an oscillation circuit for generating an alternating current at a predetermined frequency;
a pulse transforming circuit, coupled to said oscillation circuit, for transforming the alternating current into rectangular waves; and
first and second output buffers, coupled to said pulse transforming circuit, for transferring said rectangular waves to said pulse signal transmitting means.

11. A plasma processing apparatus as set forth in claim 8 wherein said RF bias modulation means varies the RF voltage so as to provide a pulse of RF of decreasing amplitude.

12. A plasma processing apparatus as set forth in claim 8 wherein the said RF bias modulation means varies the RF voltage so as to provide a narrow pulse of RF comprising a base portion and a peak portion.

* * * * *